(12) United States Patent
Newman et al.

(10) Patent No.: US 9,947,861 B2
(45) Date of Patent: Apr. 17, 2018

(54) HIGH PERFORMANCE MICROWAVE DIELECTRIC SYSTEMS AND METHODS

(71) Applicants: Nathan Newman, Tempe, AZ (US); Lingtao Liu, Tempe, AZ (US)

(72) Inventors: Nathan Newman, Tempe, AZ (US); Lingtao Liu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 582 days.

(21) Appl. No.: 14/464,518

(22) Filed: Aug. 20, 2014

(65) Prior Publication Data

US 2016/0352314 A1    Dec. 1, 2016

Related U.S. Application Data

(60) Provisional application No. 61/868,896, filed on Aug. 22, 2013.

(51) Int. Cl.

| H03K 3/59 | (2006.01) |
|---|---|
| H01L 43/08 | (2006.01) |
| H01B 3/12 | (2006.01) |
| H01B 3/10 | (2006.01) |
| C04B 35/468 | (2006.01) |
| C04B 35/491 | (2006.01) |
| C04B 35/495 | (2006.01) |

(52) U.S. Cl.
CPC .......... *H01L 43/08* (2013.01); *C04B 35/4686* (2013.01); *C04B 35/491* (2013.01); *C04B 35/495* (2013.01); *H01B 3/10* (2013.01); *H01B 3/12* (2013.01); *C04B 2235/3215* (2013.01); *C04B 2235/3251* (2013.01); *C04B 2235/3275* (2013.01); *C04B 2235/3281* (2013.01); *C04B 2235/3284* (2013.01); *C04B 2235/76* (2013.01); *C04B 2235/761* (2013.01); *C04B 2235/768* (2013.01)

(58) Field of Classification Search
CPC ........ H01G 7/025; H01G 7/026; H01G 7/028; H01L 43/08; H03K 3/59
USPC ................................................. 427/547, 598
See application file for complete search history.

(56) References Cited

U.S. PATENT DOCUMENTS

| 4,487,842 A | 12/1984 | Nomura et al. |
| 5,187,461 A | 2/1993 | Brommer et al. |
| 6,774,077 B2 | 8/2004 | Sengupta et al. |

(Continued)

FOREIGN PATENT DOCUMENTS

WO    2001/078085    10/2001

OTHER PUBLICATIONS

Physical Review Letters vol. 109, Issue 25, 257601-1 to 257601-5, 2012.*

(Continued)

*Primary Examiner* — Tabassom Tadayyon Eslami
(74) *Attorney, Agent, or Firm* — Snell & Wilmer L.L.P.

(57) ABSTRACT

Loss tangents in microwave dielectric materials may be modified (increased and/or reduced), particularly at cryogenic temperatures, via application of external magnetic fields. Exemplary electrical devices, such as resonators, filters, amplifiers, mixers, and photonic detectors, configured with dielectric components having applied magnetic fields may achieve improvements in quality factor and/or modifications in loss tangent exceeding two orders of magnitude.

12 Claims, 15 Drawing Sheets

(56) References Cited

U.S. PATENT DOCUMENTS

| | | | |
|---|---|---|---|
| 7,754,634 | B2 | 7/2010 | Chen et al. |
| 8,609,017 | B2 | 12/2013 | Sengupta et al. |
| 2003/0119656 | A1 | 6/2003 | Chiu et al. |
| 2005/0088248 | A1* | 4/2005 | White .................. G04F 5/14 331/94.1 |
| 2013/0194723 | A1* | 8/2013 | Felten ................. H01G 11/30 361/502 |

OTHER PUBLICATIONS

Applied Physical Letters vol. 101, 252901-1 to 252901-5, 2012.*
M. R. Varma (Journal of Material Science: Mater Electron (2007) 18:441-446).*
Liu L. et al., "Microwave Loss in the High-Performance Dielectric Ba(Zn1/3Ta2/3)O3 at 4.2 K", Physical Review Letters, vol. 109, Issue 25, pp. 257601-1-257601-5 (Dec. 21, 2012).
Rakhimov R. et al., "Low-field microwave response and electron paramagnetic resonance identification of valence states of manganese including octahedral Mn 5+ in YAlO 3 and CaYAlO 4", Journal of Applied Physics, vol. 95, Issue 10, pp. 5653-5660 (May 15, 2004).
Tamura H. et al., "Lattice Vibrations of Ba(Zn1/3Ta2/3)O3 Crystal with Ordered Perovskite Structure", Japanese Journal of Applied Physics, vol. 25, Issue 6, pp. 787-791 (Jun. 1986).
Gurevich V.L. et al., "Intrinsic dielectric loss in crystals", Advances in Physics, vol. 40, Issue 6, 719-767 (Jan. 24, 1991).
Subbaswamy K.R. et al., "Theory of microwave absorption in wide-band-gap insulators: The role of thermal phonon lifetimes", Physical Review Bulletin, vol. 33, Issue 6, pp. 4213-4220 (Mar. 15, 1986).
Schickfus M.V. et al., "The dielectric coupling of low-energy excitations in vitreous silica to electromagnetic waves", Journal of Physics C, Solid State Phys., vol. 9, Issue 16, pp. L439-L442 (Jul. 7, 1976).
Pappas D.P. et al., "Two Level System Loss in Superconducting Microwave Resonators", IEEE Transactions on Applied Superconductivity, vol. 21, Issue 3, pp. 871-874 (Jun. 2011).
Bleaney B. et al., "Paramagnetic Resonance and Hyperfine Structure in Four Cobalt Salts", Proceedings of the Royal Society of London, Series A, Mathematical & Physical Sciences, vol. 208, Issue 1093, pp. 143-158 (Aug. 22, 1951).
Davies P.K. et al., "Effect of ordering-induced domain boundaries on low-loss Ba(Zn1/3Ta2/3)O-3-BaZrO3 perovskite microwave dielectrics", Journal of the American Ceramic Society, vol. 80, Issue 7, pp. 1727-1740 (Jul. 1997).
Martinis J.M. et al., "Decoherence in Josephson qubits from dielectric loss", Physical Review Letters, vol. 95, Issue 21, pp. 210503-1-210503-4 (Nov. 18, 2005).
Weides M.P. et al., "Coherence in a transmon qubit with epitaxial tunnel junctions", Applied Physics Letters, vol. 99, Issue 26, pp. 262502-1-262502-3 (Dec. 27, 2011).
Konopka J. et al., "Dielectric properties of CaNdAlO4 at microwave frequencies", Journal of Applied Physics, vol. 72, Issue 1, pp. 218-223 (Jul. 1, 1992).
Varma M.R. et al., "Effect of dopants on the low temperature microwave dielectric properties of Ba(Zn1/3Ta2/3)O3 ceramics", Journal of Materials Science, Materials in Electronics, vol. 18, Issue 4, pp. 441-446 (2007).
Tamura H. et al., "Low Temperature Properties of Microwave Dielectrics", Japanese Journal of Applied Physics, vol. 28, Supplement 28-2, pp. 21-23 (May 12, 1989).
Konopka J. et al., "Dielectric Properties of Substrates for Deposition of High-Tc Thin Films Up to 40 GHz", IEEE Transactions on Microwave Theory and Techniques, vol. 40, Issue 12, pp. 2418-2423 (Dec. 1992).
Krupka J. et al., "Dielectric properties of single crystals of Al2/O3, LaAlO3, NdGaO3, SrTiO3, and MgO at cryogenic temperatures", IEEE Transactions on Microwave Theory and Techniques, vol. 42, Issue 10, pp. 1886-1890 (Oct. 1994).
Liu S. et al., "Experimental and theoretical investigation of the structural, chemical, electronic, and high frequency dielectric properties of barium cadmium tantalate-based ceramics", Journal of Applied Physics, vol. 97, Issue 1, pp. 014105-1-014105-8 (2005).
Taber R. C., "A parallel plate resonator technique for microwave loss measurements on superconductors", Review of Scientific Instruments, vol. 61, Issue 8, pp. 2200-2206 (Aug. 1990).
Stoll S. et al., "EasySpin, a comprehensive software package for spectral simulation and analysis in EPR", Journal of Magnetic Resonance, vol. 178, Issue 1, pp. 42-55 (Sep. 26, 2006).
Flores M. et al., "Protein-cofactor interactions in bacterial reaction centers from Rhodobacter sphaeroides R-26: II. Geometry of the Hydrogen bonds to the primary quinone QA by 1H and 2H ENDOR spectroscopy", Biophysical Journal, vol. 92, Issue 2, pp. 671-682 (Jan. 2007).
Rosenbaum F.J., "Dielectric Cavity Resonator for ESR Experiments", Review of Scientific Instruments, vol. 35, Issue 11, pp. 1550-1554 (Nov. 1964).
Walsh W.M. et al., "Enhanced ESR sensitivity using a dielectric resonator", Review of Scientific Instruments, vol. 57, Issue 9, pp. 2278-2279 (Sep. 1986).
Krzystek J. et al., "Multi-frequency, high-field EPR as a powerful tool to accurately determine zero-field splitting in high-spin transition metal coordination complexes", Coordination Chemistry Reviews, vol. 250, Issue 17-18, pp. 2308-2324 (Apr. 25, 2006).
Gesmundo F. et al., "An EPR Study of Magnetic Interactions in Solid Solutions Between MgO and Antiferromagnetic Oxides. I. MgO-NiO", Journal of Solid State Chemistry, vol. 8, Issue 4, pp. 287-296 (1973).
Liu et al., "The dominance of paramagnetic loss in microwave dielectric ceramics at cryogenic temperatures", Applied Physical Letters, vol. 101, Issue 25, pp. 252901-1-252901-5 (Dec. 17, 2012).
Tamura H., "Microwave Loss Quality of (ZR0.8SN0.2)TlO4", American Ceramic Society Bulletin, vol. 73, Issue 10, pp. 92-95 (Oct. 1994).
Wakino K. et al., "Far Infrared Reflection Spectra of Ba(Zn,Ta)O3-BaZrO3 Dielectric Resonator Material", Journal of the American Ceramic Society, vol. 69, Issue 1, pp. 34-37 (1986).
Liu S., "Growth and Characterization of Barium Tantalate-based Microwave Ceramics & Barium and Strontium Titante Ferroelectrics", Arizona State University, Ph.D. dissertation, 2012.
Chu Y.J. et al., "Reaction Sintering Process for Improving the Microwave Dielectric Properties of Ba2Ti9O20 Materials", Piers Online, vol. 3, No. 4, pp. 544-548 (2007).
Reaney I.M. et al., "Microwave Dielectric Ceramics for Resonators and Filters in Mobile Phone Networks", Journal of American Ceramic Society, vol. 89, No. 7, pp. 2063-2072 (Jul. 2006).
Zurmuhlen R. et al., "Structure of Ba(Y+3 1/2Ta+5 1/2)O3 and its dielectric properties in the range 102-1014 Hz, 20-600 K", Journal of Applied Physics, vol. 76, No. 10, pp. 5864-5873 (Nov. 15, 1994).
Date M. et al., "Antiferromagnetic Resonance in Hydrated Copper Salts", Journal of Applied Physics, vol. 34, No. 4 (Part 2), pp. 1038-1044 (Apr. 1963).
Newman N. et al., "YBa2Cu3O7-δ superconducting films with low microwave surface resistance over large areas", Applied Physics Letters, vol. 57, No. 5, pp. 520-522 (Jul. 30, 1990).
Rong G. et al., "Role of Ni and Zr doping on the electrical, optical, magnetic, and structural properties of barium zinc tantalate ceramics", Journal of Materials Research, vol. 14, No. 10, pp. 4011-4019 (Oct. 1999).
Villacampa B. et al., "EPR and optical study of Ni2+ ions in CsCaF3 and CsCdF3", Journal of Physics, Chemical, Solids, vol. 55, No. 3, pp. 263-272 (1994).
Schloemann E., "Dielectric Losses in Ionic Crystals with Disordered Charge Distributions", Physical Review, vol. 135, No. 2A, pp. A413-A419 (Jul. 20, 1964).
Smith SRP et al., "Electron-Paramagnetic-Resonance Line Shape of Ni2+ in MgO", Physical Review, vol. 178, No. 2, pp. 471-480 (Feb. 10, 1969).
Shuskus AJ, "Electron Spin Resonance of Fe3+ and Mn2+ in Single Crystals of CaO", Physical Review, vol. 127, No. 5, pp. 1529-1531 (Sep. 1, 1962).

(56) References Cited

OTHER PUBLICATIONS

Varma MR et al., "Effect of Dopants on Microwave Dielectric Properties of Ba(Zn1/3Ta2/3)O3 Ceramics", Japanese Journal of Applied Physics, vol. 44, No. 1A, pp. 298-303 (2005).

Tamura H et al., "Low Temperature Properties of Microwave Dielectrics", Japanese Journal of Applied Physics, vol. 28, Supplement 28-2, pp. 21-23 (1989).

Tamura H, "Microwave dielectric losses caused by lattice defects", Journal of the European Ceramic Society, vol. 26, pp. 1775-1780 (2006).

Klein N. et al., "Novel dielectric resonator structures for future microwave communication systems", Journal of the European Ceramic Society, vol. 21, pp. 2687-2691 (2001).

Kawashima S. et al., "Ba(ZN1/3Ta2/3)O3 Ceramics with Low Dielectric Loss at Microwave Frequencies", Journal of the American Ceramic Society, vol. 66, pp. 421-423 (Jun. 1983).

Tamura H. et al., "Improved High-Q Dielectric Resonator with Complex Perovskite Structure", Communications of the American Ceramic Society, vol. 67, pp. C-59-C61 (Apr. 1984).

Wakino K. et al., "Microwave Characteristics of (Zr,Sn)TiO4 and BaO—PbO—Nd2O3—TiO2 Dielectric Resonators", Journal of the American Ceramic Society, vol. 67, No. 4, pp. 278-281 (Apr. 1984).

Christofferson R. et al., "Effect of Sn Substitution on Cation Ordering in (Zr1-xSnx)TiO4 Microwave Dielectric Ceramics", Journal of the American Ceramic Society, vol. 77, No. 6, pp. 1441-1450 (Jun. 1994).

Sagala D.A. et al., "Lattice Energy Calculations for Ordered and Disordered Ba(Zn1/3Ta2/3)O3", Journal of the Physical Society of Japan, vol. 61, No. 5, pp. 1791-1797 (May 1992).

Kim D.W. et al., "Influence of Copper(II) Oxide Additions to Zinc Niobate Microwave Ceramics on Sintering Temperature and Dielectric Properties", Journal of the American Ceramic Society, vol. 84, No. 6, pp. 1286-1290 (Jun. 2001).

RiaziKhoei P. et al., "The Influence of ZnNb2O6 on the Microwave Dielectric Properties of ZrTi2O6 Ceramics", Journal of the American Ceramic Society, vol. 89, No. 1, pp. 216-223 (Jan. 2006).

Breeze J.D. et al., "Do Grain Boundaries Affect Microwave Dielectric Loss in Oxides?", Journal of the American Ceramic Society, vol. 92, No. 3, pp. 671-674 (Mar. 2009).

Penn SJ et al., "Effect of Porosity and Grain Size on the Microwave Dielectric Properties of Sintered Alumina", Journal of the American Ceramic Society, vol. 80, No. 7, pp. 1885-1888 (Jul. 1997).

Negas T et al., "BaTi4O9/Ba2Ti9O20-based ceramics—resurrected for—modern microwave applications", American Ceramoc Society Bulletin, vol. 72, No. 1, pp. 80-89, (Jan. 1993).

* cited by examiner

HIGH PERFORMANCE MICROWAVE DIELECTRIC SYSTEMS AND METHODS

CROSS REFERENCE TO RELATED APPLICATIONS

This application claims priority to, and the benefit of, U.S. Provisional Application Ser. No. 61/868,896 entitled "HIGH PERFORMANCE MICROWAVE DIELECTRIC" and filed Aug. 22, 2013, which is incorporated herein by reference in its entirety.

FEDERALLY SPONSORED RESEARCH OR DEVELOPMENT

This invention was made with government support under grant number W911NF-11-1-0508 awarded by the Army Research Office. The Government has certain rights in the invention.

TECHNICAL FIELD

The present disclosure relates to dielectric materials, and in particular to reduction and/or modification of loss tangents in dielectric materials containing paramagnetic additives via application of an external magnetic input or signal.

BACKGROUND

Certain existing dielectric materials, for example dielectric materials suitable for microwave operation, and devices incorporating the same suffer from various shortcomings, for example excessive and/or temperature-varying loss tangents. Accordingly, improved dielectric materials and devices incorporating the same remain desirable.

SUMMARY

In an exemplary embodiment, a method for modifying the loss tangent in an electrical device comprises operating the electrical device having a dielectric component containing a paramagnetic additive. The operating subjects the dielectric component to electromagnetic radiation having a frequency of between 0.2 GHz and 120 GHz. The method further comprises applying a static magnetic field to the dielectric component to modify the loss tangent in the dielectric component.

In another exemplary embodiment, a method for varying the transfer function of an electrical device comprises operating the electrical device having a dielectric component containing a paramagnetic additive. The operating subjects the dielectric component to electromagnetic radiation having a frequency of at least 0.2 GHz. The method further comprises applying a magnetic field to the dielectric component to modify the transfer function of the electrical device.

In another exemplary embodiment, an electrical device configured with a reduced loss tangent comprises: an active electrical component comprising a dielectric material; and a magnetic field generation component configured to apply a static magnetic field to the dielectric material.

In yet another exemplary embodiment, a method for reducing loss in a dielectric material comprises: determining, for paramagnetic ions in the dielectric material, a preferential spin alignment; and applying, to the dielectric material, a static magnetic field to cause the paramagnetic ions to assume the preferential spin alignment.

In still another exemplary embodiment, a method for modifying loss in a dielectric material comprises: determining, for paramagnetic ions in the dielectric material, a resonant spin loss; and applying, to the dielectric material, a static magnetic field to attain a resonant condition for the paramagnetic ions and modify the loss tangent of the dielectric material.

The contents of this summary section are provided only as a simplified introduction to the disclosure, and are not intended to be used to limit the scope of the appended claims.

BRIEF DESCRIPTION OF THE DRAWINGS

With reference to the following description and accompanying drawings.

DETAILED DESCRIPTION

Figure 1A:
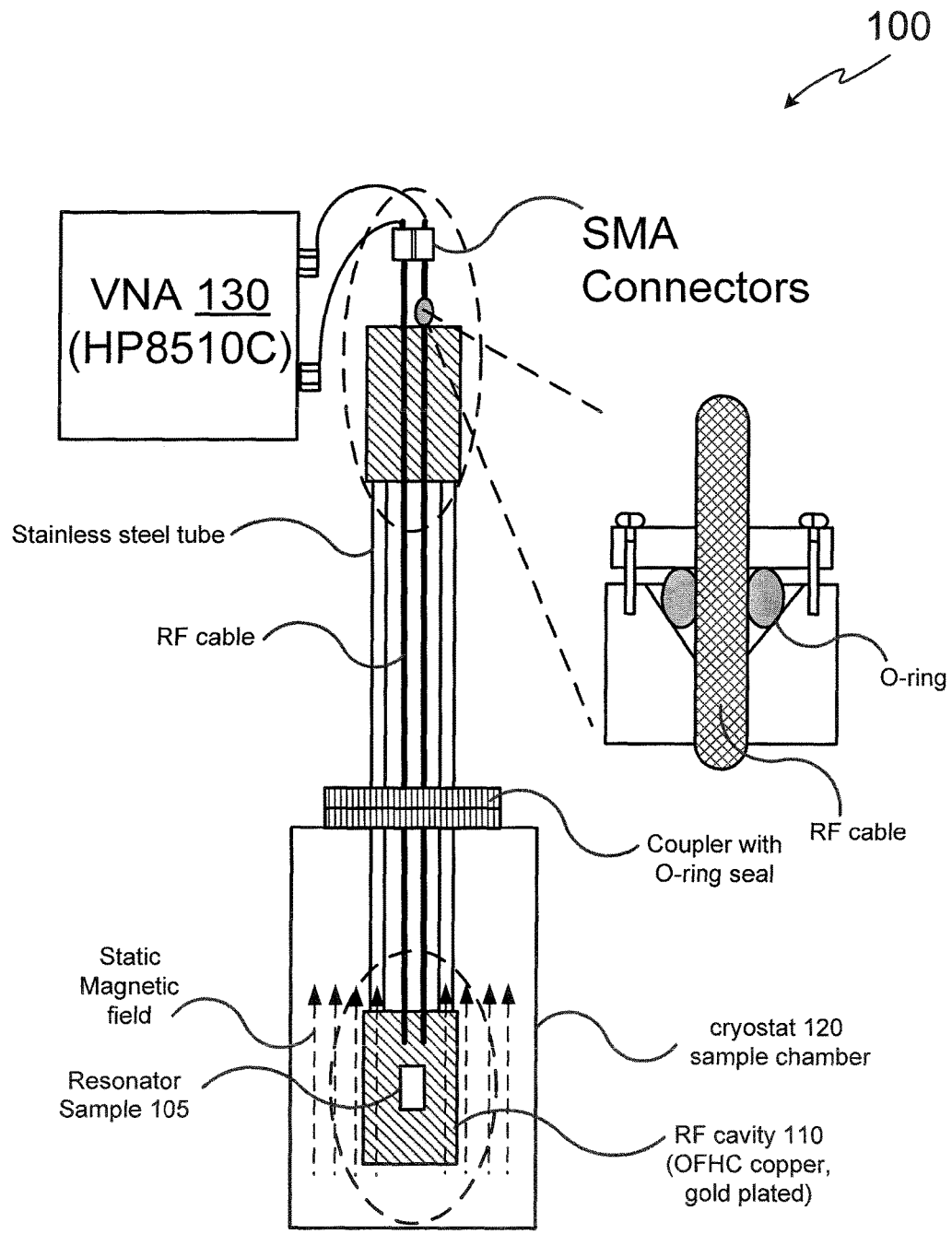
FIG. 1A illustrates an exemplary system for characterizing microwave material and/or device properties over a range of temperatures and/or magnetic fields in accordance with various exemplary embodiments.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from principles of the present disclosure.

For the sake of brevity, conventional techniques for dielectric material fabrication, characterization, use, and the like, and/or devices, systems, and methods incorporating or based on the same, may not be described in detail herein. Furthermore, the connecting lines shown in various figures contained herein are intended to represent exemplary functional relationships and/or physical couplings between various elements. It should be noted that many alternative or additional functional relationships or physical connections may be present in a practical high performance microwave dielectric and/or electrical devices incorporating the same.

In accordance with principles of the present disclosure, performance of various electrical devices, for example resonators, filters, amplifiers, mixers, photonic detectors, and/or the like, may be improved and/or refined. For example, the quality factor of resonators, or performance of microwave filters, may be improved via use of dielectric resonators subjected to a magnetic field. Exemplary methods and systems may be applied both at low temperatures and with high magnetic fields, and at higher temperatures and with lower magnetic fields. Magnetic fields may be applied using a variety of methods for generation of such fields (for example, using permanent magnets or using electromagnets formed using electromagnetic circuits or devices).

In accordance with various exemplary embodiments, the loss tangent of microwave dielectrics may be reduced and/or modified via application of a magnetic field. In certain exemplary embodiments, the effect is prominent at low temperature. In certain exemplary embodiments, the effect is prominent at low temperature and when transition metals with unpaired d-electrons are utilized. The effect may also be seen at higher temperatures (i.e., up to and exceeding 300 K) and with other paramagnetic additives. Reducing and/or modifying the loss tangent of high dielectric constant dielectric materials is extremely desirable, particularly for microwave communication and radar systems where losses in dielectric resonators and/or filters limit the overall performance of the system.

Properties of certain dielectric materials, for example:
$Ba(Mg_{1/3}Ta_{2/3})O_3$
Ni- and Zr-alloyed $Ba(Zn_{1/3}Ta_{2/3})O_3$
Co-alloyed $Ba(Zn_{1/3}Nb_{2/3})O_3$
$ZrTiO_4$—$ZnNb_2O_6$
$BaTi_4O_9$—$BaZn_2Ti_4O_{11}$
and/or the like may be improved and/or optimized by adding certain dopants and/or solid solution alloy agents, for example Ni, Zr, Co, Mn, and Cu (sometimes referred to herein as "additives"). Certain rare earth paramagnetic materials may also be utilized as additives. These impurities can act as sintering aids to enhance the manufacturability, crystal quality, and/or density, and thus ultimately the quality factor Q. Additionally, these impurities can be utilized to increase the dielectric constant and/or adjust the resonance frequency $\tau_f$ to a value close to or equal to zero.

However, these and other paramagnetic impurities can also have significant effects on the loss tangent of the material, and the effect may vary significantly across temperatures. Principles of the present disclosure demonstrate that the dominant loss process in exemplary microwave dielectrics containing paramagnetic transition metal additives at cryogenic temperatures is resonant spin excitations of unpaired d-electrons: (i) for small dopant concentrations (i.e., about 3% to about 8% mole fraction or less), within isolated transition metal atoms; and (ii) for higher dopant concentrations (i.e., typically greater than about 8% mole fraction), within exchange-coupled transition metal clusters.

Accordingly, in contrast to the shortcomings of prior devices and materials, application of principles of the present disclosure enables higher performance electronic devices, for example resonators, filters, and other microwave devices. Resonators and oscillators may be configured with higher quality factors and/or lower intensity and phase noise. Filters may be configured to achieve lower insertion loss, sharper skirts, and/or lower intensity and phase noise. Additionally, the transfer function of exemplary electronic devices configured in accordance with principles of the present disclosure, for example resonators, oscillators, filters, and/or the like, can be tuned by varying an applied magnetic field, for example by changing the position of a permanent magnet, or the current magnitude and/or direction of a magnetic coil. The applied magnetic field can modify the resonant spin loss properties and can create a preferential spin alignment in the dielectric material, reducing and/or modifying the loss tangent and/or other electromagnetic properties of the dielectric material.

With reference now to FIG. 1A, in accordance with various exemplary embodiments, exemplary microwave measurements to assess the loss tangent of certain dielectric materials may be performed in transmission utilizing a dielectric resonator (DR) technique. An exemplary system 100 for measurement is illustrated in FIG. 1A. In an exemplary embodiment, DR measurements may be made using rectangular resonators 105 of a suitable size, for example, 8.5 mm×6.5 mm×2 mm. The resonators may be loaded into a suitable cavity 110, for example a gold-plated copper cavity having dimensions of about 2 cm×0.6 cm×1.5 cm, and the cavity may be affixed to the end of a cryogenic dipping probe. For measurements without an applied external magnetic field, the probe may be inserted into a helium dewar or other suitable cooling device. For measurements including an applied external magnetic field, the probe may be inserted into a suitable cryostat 120 (for example, PPMS, Model 6000 from Quantum Design in San Diego, Calif., or the like). In a suitable cryostat, measurements at temperatures as low as about 2 Kelvin and under applied external magnetic fields as high as about 9 Tesla may be achieved.

A microwave vector network analyzer (VNA) 130, for example the Hewlett-Packard 8510C or similar, may be used to source transverse electromagnetic modes and then measure $S_1$ vector values. These values may be fit to a circle in the Smith chart to infer the Q factor. In various exemplary embodiments, the distance between the coupling loops and the sample material may be configured to be weakly coupled; in this manner, the unloaded Q may be determined at a precision within a few percent. Loss tangent values measured with the DR measurement technique align closely with values obtained when using superconducting parallel plate resonator (PPR) techniques, likely due to confinement of fields in the high dielectric constant materials and thus minimizing the radiation and near field losses. For the dielectric materials in question, chemical composition and trace amounts of impurities may be obtained utilizing secondary ion mass spectroscopy (SIMS) and particle induced X-ray emission (PIXE).

Figure 1B:
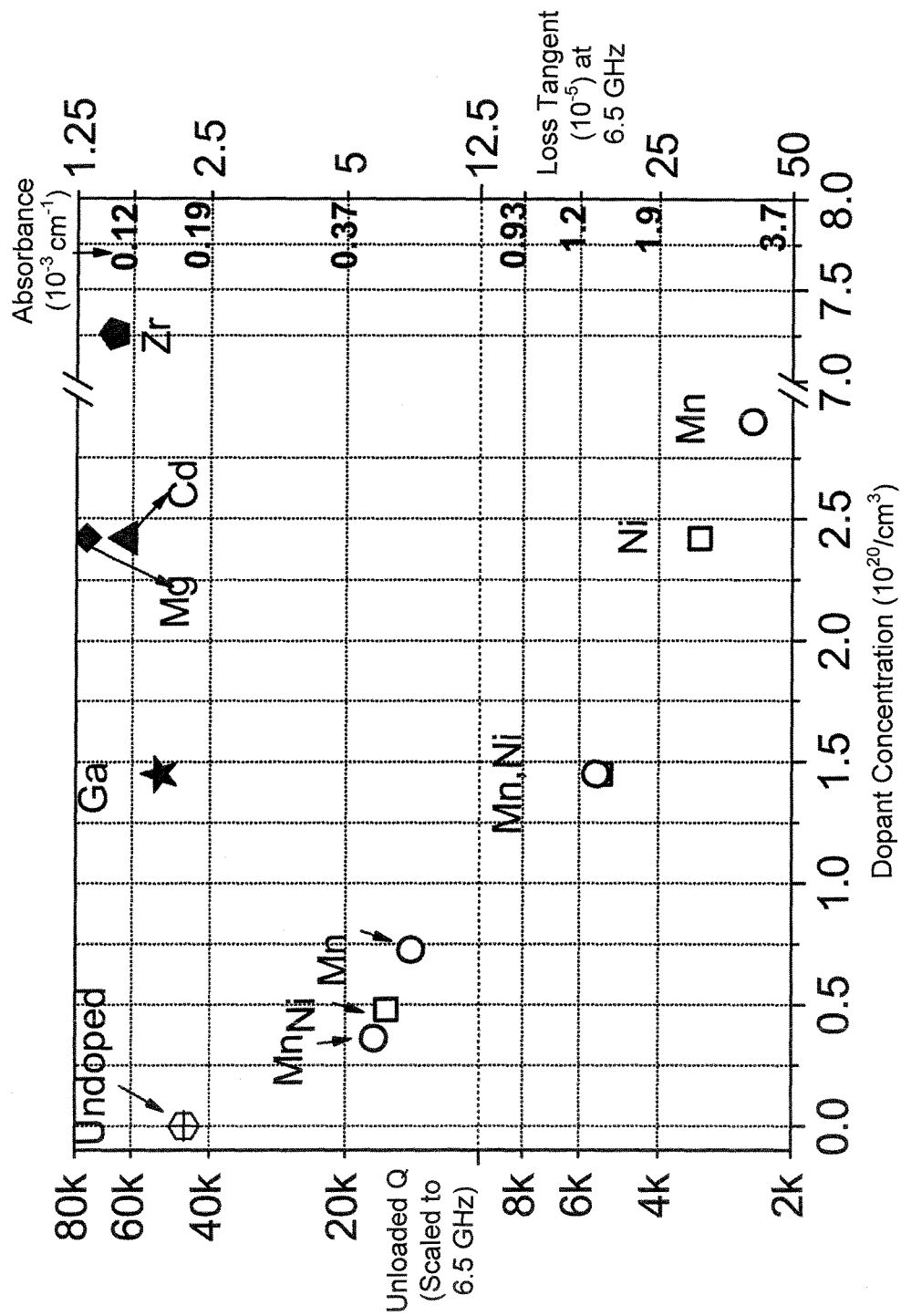
FIG. 1B illustrates unloaded Q factor and loss tangent of $Ba(Zn_{1/3}Ta_{2/3})O_3$ (BZT) doped with various impurities measured with a parallel plate resonator configuration at 4.2 K and no applied magnetic field in accordance with an exemplary embodiment.
Figure 1C:
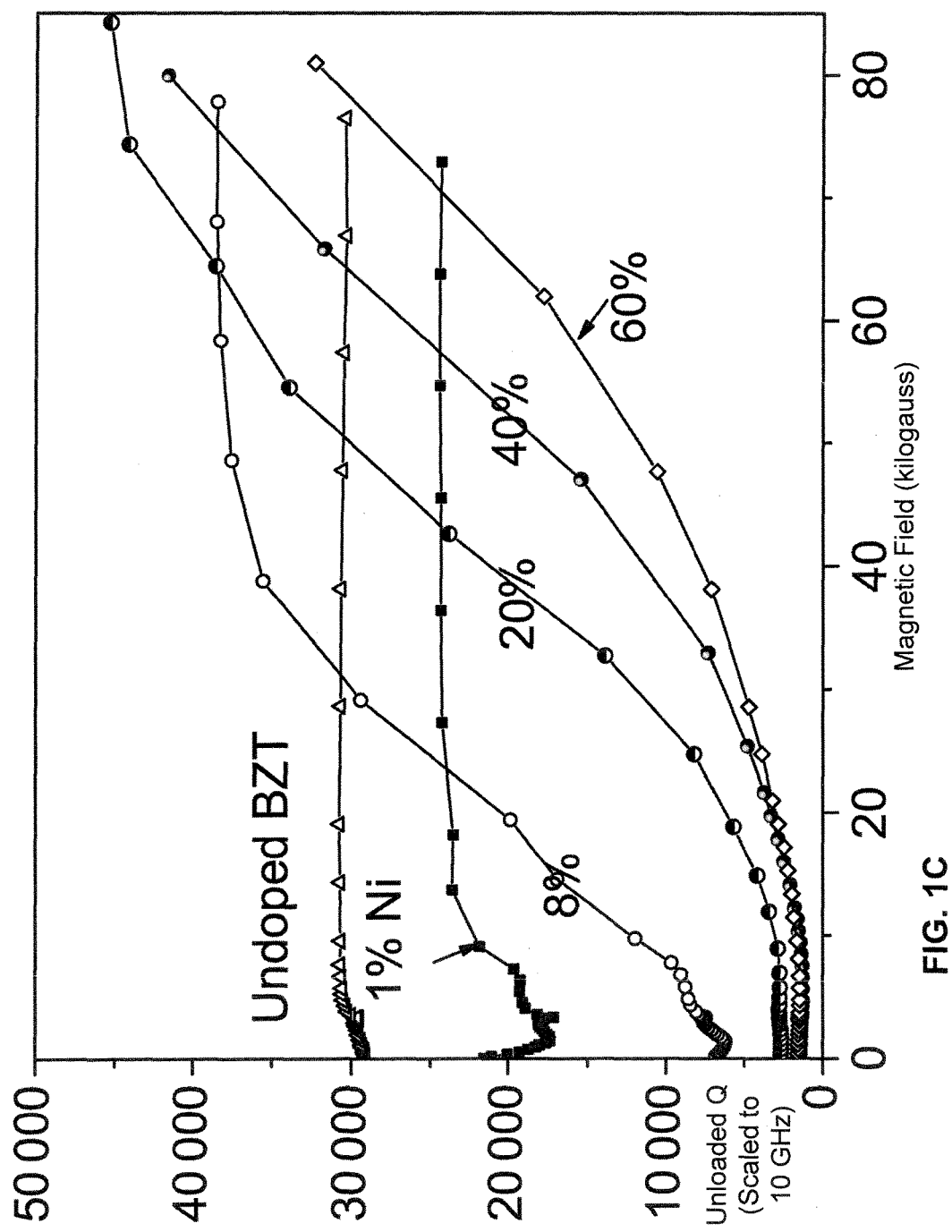
FIG. 1C illustrates measured Q of Ni-doped ceramic BZT at 4.2 K measured using a dielectric resonator configuration in accordance with an exemplary embodiment.
Figure 1D:
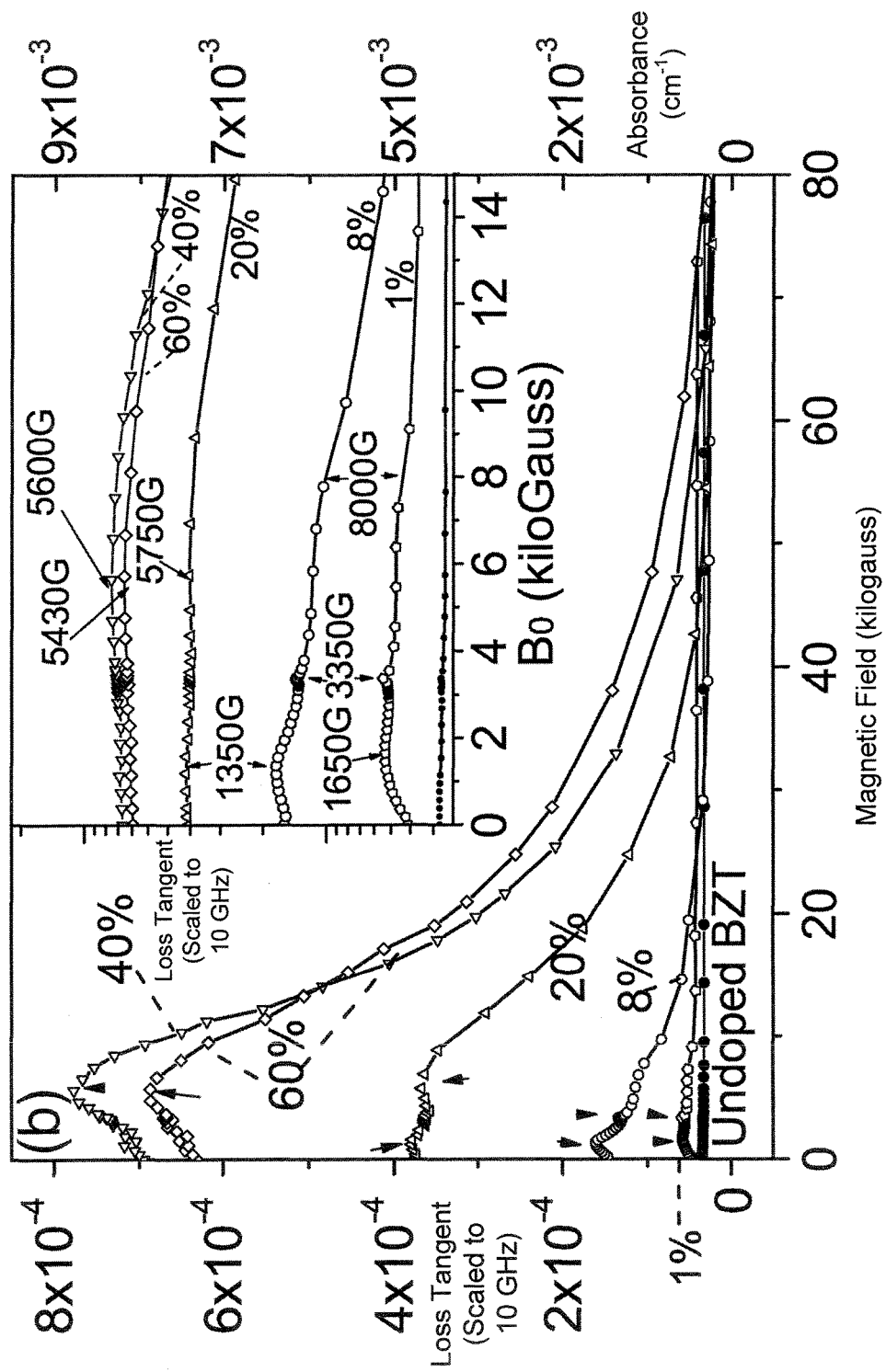
FIG. 1D illustrates inferred loss tangent and absorbance of Ni-doped ceramic BZT at 4.2 K measured using a dielectric resonator configuration in accordance with an exemplary embodiment.

Exemplary measurements via system 100 of loss tangent and unloaded Q factor for BZT doped with various impurities, as measured at 4.2 K and under no applied magnetic field, are illustrated in FIG. 1B. Exemplary measurements via system 100 of unloaded Q factor of Ni-doped BZT, measured at 4.2 K and across a range of applied magnetic fields, are illustrated in FIG. 1C. Inferred loss tangent and absorbance of the materials in FIG. 1C are illustrated in FIG. 1D. In FIG. 1D, the inset illustrates an expanded view at low magnetic field values, and arrows point at EPR resonant absorption peak maxima. Additionally, exemplary measurements via system 100 illustrating temperature dependence of microwave loss tangent from 4.2 K to 300 K are illustrated in FIG. 1E for BZT and for various materials in FIG. 2A.

Figure 1E:
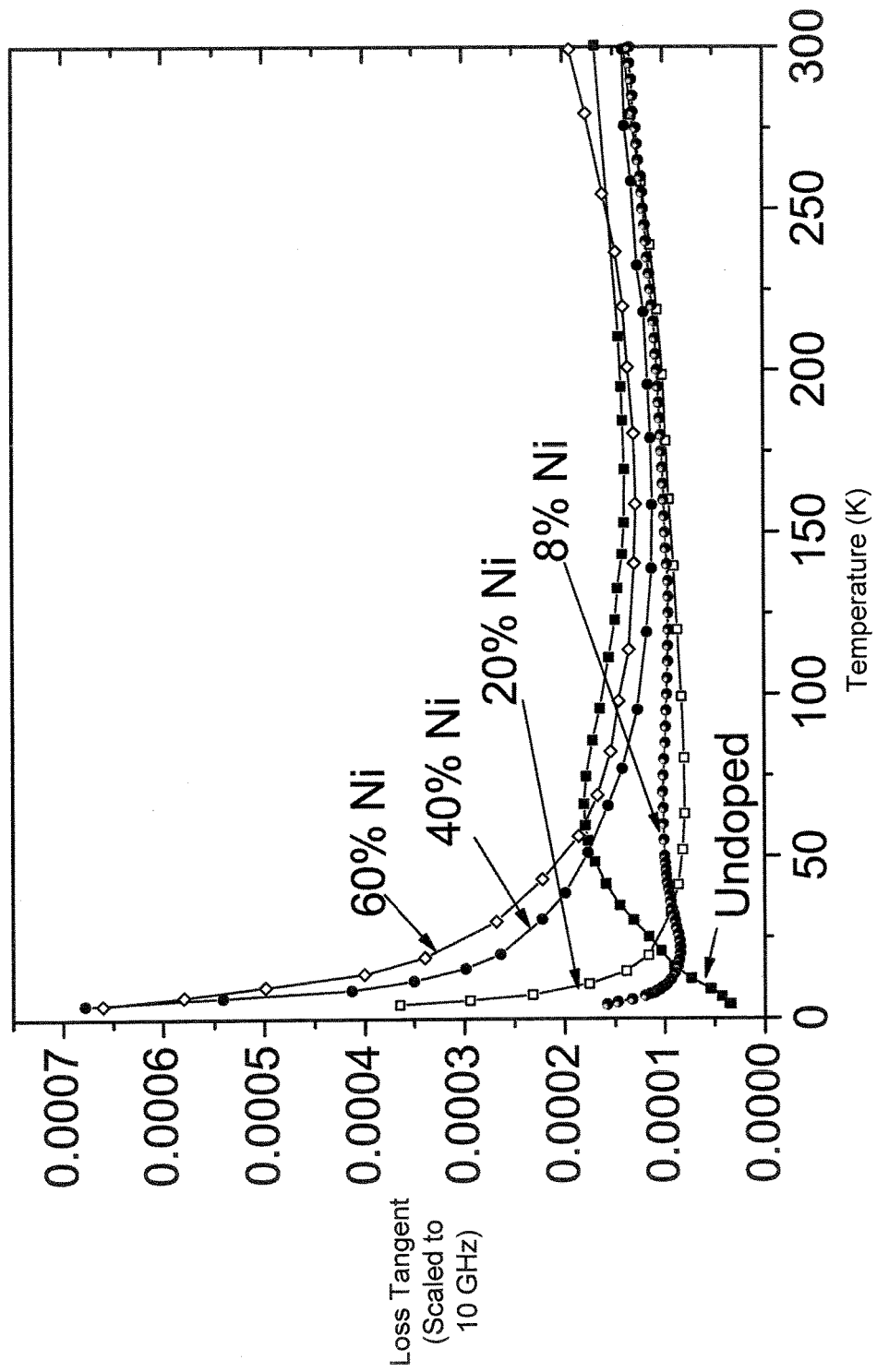
FIG. 1E illustrates loss tangents of Ni-doped ceramic BZT as a function of temperature in accordance with an exemplary embodiment.
Figure 2A:
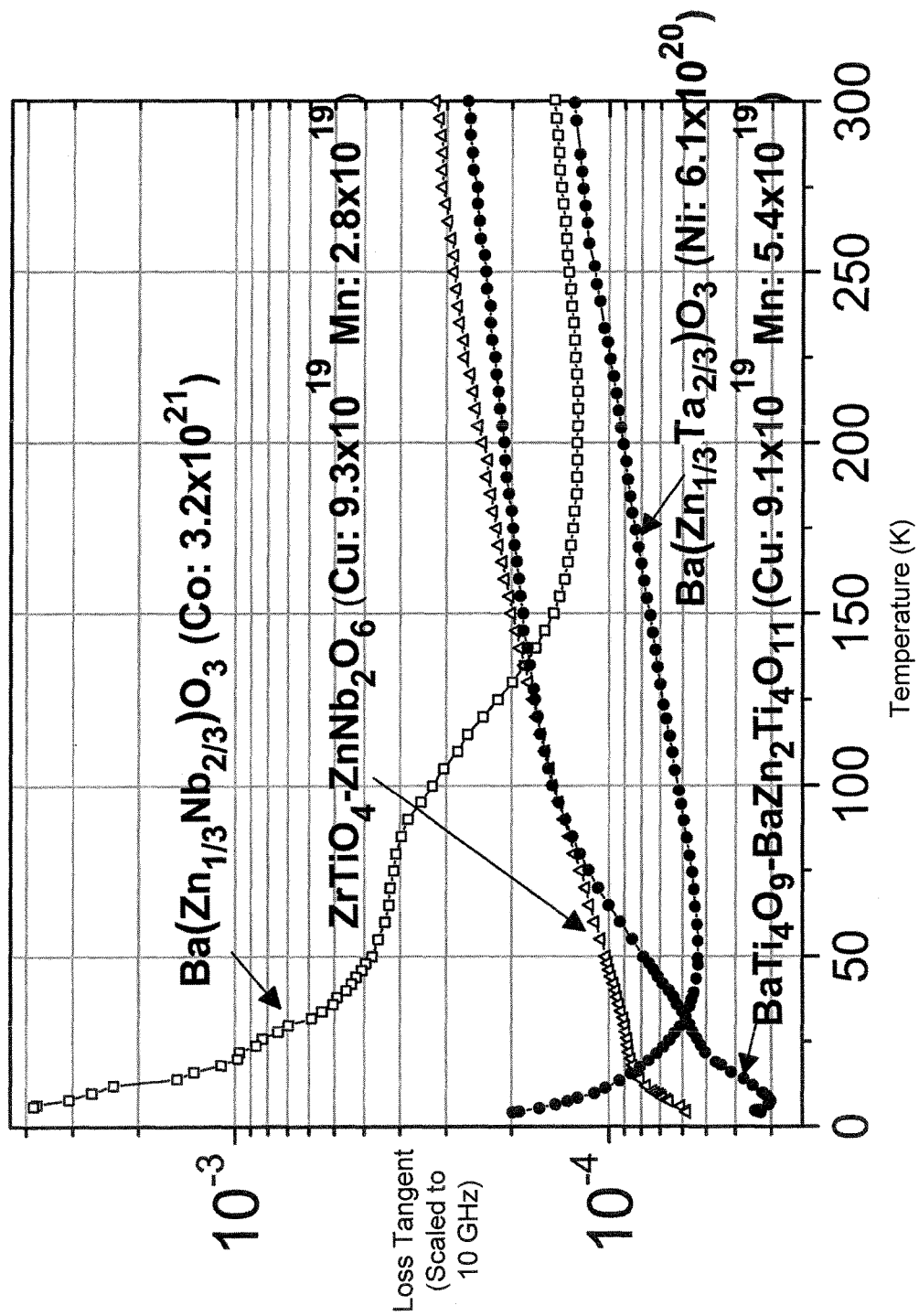
FIG. 2A illustrates loss tangents of exemplary commercially available dielectric materials as a function of temperature in accordance with an exemplary embodiment.

Continuing to reference FIG. 1E, as the temperature of BZT falls from 300 K toward 4.2 K, the loss tangent initially decreases. However, as the temperature falls further, significant increases in loss tangent occur. The loss scales with the doping concentration of Ni. The temperature where the loss tangent starts to increase varies with the doping level: for 8% Ni, about 20 K; for 20% Ni, about 60 K; and for 40% Ni, about 160K. With momentary reference to FIG. 2A, corresponding temperatures are: for $BaTi_4O_9$—$BaZn_2Ti_4O_{11}$, about 10 K; for $Ba(Zn_{1/3}Ta_{2/3})O_3$, about 50 K; and for $Ba(Zn_{1/3}Nb_{2/3})O_3$, about 200 K.

PIXE and SIMS may be utilized to verify that the samples have transition metal ions, for example as illustrated in Table 1.

TABLE 1

| $ZrTiO_4$—$ZnNb_2O_6$ | | $BaTi_4O_9$—$BaZn_2Ti_4O_{11}$ | | $Ba(Zn_{1/3}Nb_{2/3})O_3$ | | $Ba(Zn_{1/3}Ta_{2/3})O_3$ | |
|---|---|---|---|---|---|---|---|
| Impurity | $cm^{-3}$ | Impurity | $cm^{-3}$ | Impurity | $cm^{-3}$ | Impurity | $cm^{-3}$ |
| Cu | $9.3 \times 10^{19}$ | Cu | $9.1 \times 10^{19}$ | Co | $3.2 \times 10^{21}$ | Ni | $6.1 \times 10^{20}$ |
| Mn | $2.8 \times 10^{19}$ | Mn | $5.4 \times 10^{19}$ | Mn | $4.2 \times 10^{19}$ | | |
| Fe | $9.6 \times 10^{18}$ | Fe | $3.8 \times 10^{18}$ | Fe | $4.6 \times 10^{18}$ | | |
| Co | $7.3 \times 10^{17}$ | Co | $6.5 \times 10^{17}$ | | | | |
| Cr | $3.2 \times 10^{17}$ | Cr | $2.7 \times 10^{17}$ | | | | |

Materials with relatively high concentration of transition metal Ni and Co ions often have large microwave loss at cryogenic temperature, while materials that contain smaller and/or trace amounts of transition metal ions often have small microwave loss at similar temperatures. Accordingly, principles of the present disclosure indicate that the presence of "magnetic" additives, for example Ni, Co, Cu, Mn, and Fe, play the dominant role in the microwave loss mechanism in these exemplary dielectric materials at cryogenic temperatures.

Table 2 illustrates magnetic properties of BZT doped with a variety of Ni concentrations.

TABLE 2

| | | | From temperature-dependent low-field magnetic susceptibility measurements (characteristic of all unpaired electrons) | | From fitting Brillouin function to magnetic-field-dependent susceptibility measurements | |
|---|---|---|---|---|---|---|
| Ni | Fraction | Average Ni | $\mu_{eff} = g_J\sqrt{J(J+1)}$ | Weiss | (characteristic of clusters) | |
| concentration ($cm^{-3}$) | of Ni on Zn site | separation (Å) | per Ni atom ($\mu_B$) | temperature (K) | J (measurement temperature in K) | $M_s$ (emu/$cm^3$) {$g_J J$} |
| $5.2 \times 10^{19}$ | 1% | 27 | 3.11 | 0.5 | 0.65 (4.2) | 0.9, {1.9} |
| $4.1 \times 10^{20}$ | 8% | 13 | 2.97 | 1.4 | 1.5 (4.2) | 7.7 {2.1} |
| $1.0 \times 10^{21}$ | 20% | 9.9 | 3.03 | 1.8 | 2 (10) | 20 {2.2} |
| $2.1 \times 10^{21}$ | 40% | 7.9 | 2.96 | 3.3 | 3 (15) | 40 {2.2} |

TABLE 2-continued

| | | | | | From fitting Brillouin function to magnetic-field-dependent susceptibility measurements | |
|---|---|---|---|---|---|---|
| | | | From temperature-dependent low-field magnetic susceptibility measurements (characteristic of all unpaired electrons) | | | |
| Ni concentration ($cm^{-3}$) | Fraction of Ni on Zn site | Average Ni separation (Å) | $\mu_{eff} = g_j\sqrt{J(J+1)}$ per Ni atom ($\mu_B$) | Weiss temperature (K) | (characteristic of clusters) | |
| | | | | | J (measurement temperature in K) | $M_s$ (emu/cm$^3$) $\{g_jJ\}$ |
| $3.1 \times 10^{21}$ | 60% | 6.9 | 2.97 | 4.6 | 4 (20) | 64 {2.4} |
| $4.1 \times 10^{21}$ | 80% | 6.2 | 2.94 | 6.4 | 10 (20) | 87 {2.4} |

Doped and undoped $Ba(Zn_{1/3}Ta_{2/3})O_3$ made in a lab and doped commercial material (for example, products 2900 and 8733 available from Trans Tech, Adamstown, Md.) demonstrate the variability of loss tangent associated with application of an external magnetic field disclosed herein. Additionally, the effect may also be demonstrated in other commercial ceramics including $Ba(Zn_{1/3}Nb_{2/3})O_3+2Ba(Co_{1/3}Nb_{2/3})O_3$ chemical composition-based material (for example, product 3500 available from Trans Tech, Adamstown, Md.).

This effect may be realized in various other high performance materials, especially at low temperatures and with materials that contain or are doped with transition metal elements with unpaired d-electrons. Table 3 presents certain commercially available high performance microwave dielectrics and their approximate composition:

TABLE 3

| Sample | Composition (by PIXE)* | Additives | Major Phase | structure | Lattice Constant (A) | Substrate (A) |
|---|---|---|---|---|---|---|
| D3500 | Ba1 Zn0.1 Nb0.55 Co0.23 O~3 | | Ba(Zn0.33Nb0.67)O3 | perovskite | 4.0935 | LiF(4.026) or Ge(5.675) |
| D4300 | Zr1 Ti1.80 Zn1.08 Nb0.31 O~7 | Cu~0.035% Ca (trace) | ZrTiO4 | orthorhombic | a 4.7855 b 5.4755 c 5.0277 | Si(5.43) |
| D8300 | Ba1 Ti3.48 Zn0.50 O~9 | Ta~0.3% Rh~0.03% | BaTi4O9 | orthorhombic | a 6.2940 b 14.5324 c 3.7972 | LaAlO3(a = 3.79 c = 13.11) |

The absorption process involves localized electron spin flips (i.e., electron paramagnetic resonance (EPR) transitions) of (i) individual ions when distances between ions preclude the formation of exchange-coupled spin clusters, and/or (ii) of exchange-coupled spin clusters when the distance between ions reaches a sufficiently small value to permit formation of clusters (i.e., less than about 8 Angstroms for $Ni^{2+}$ ions, less than about 7 Angstoms for $Co^{2+}$ ions, etc).

Figure 2B:
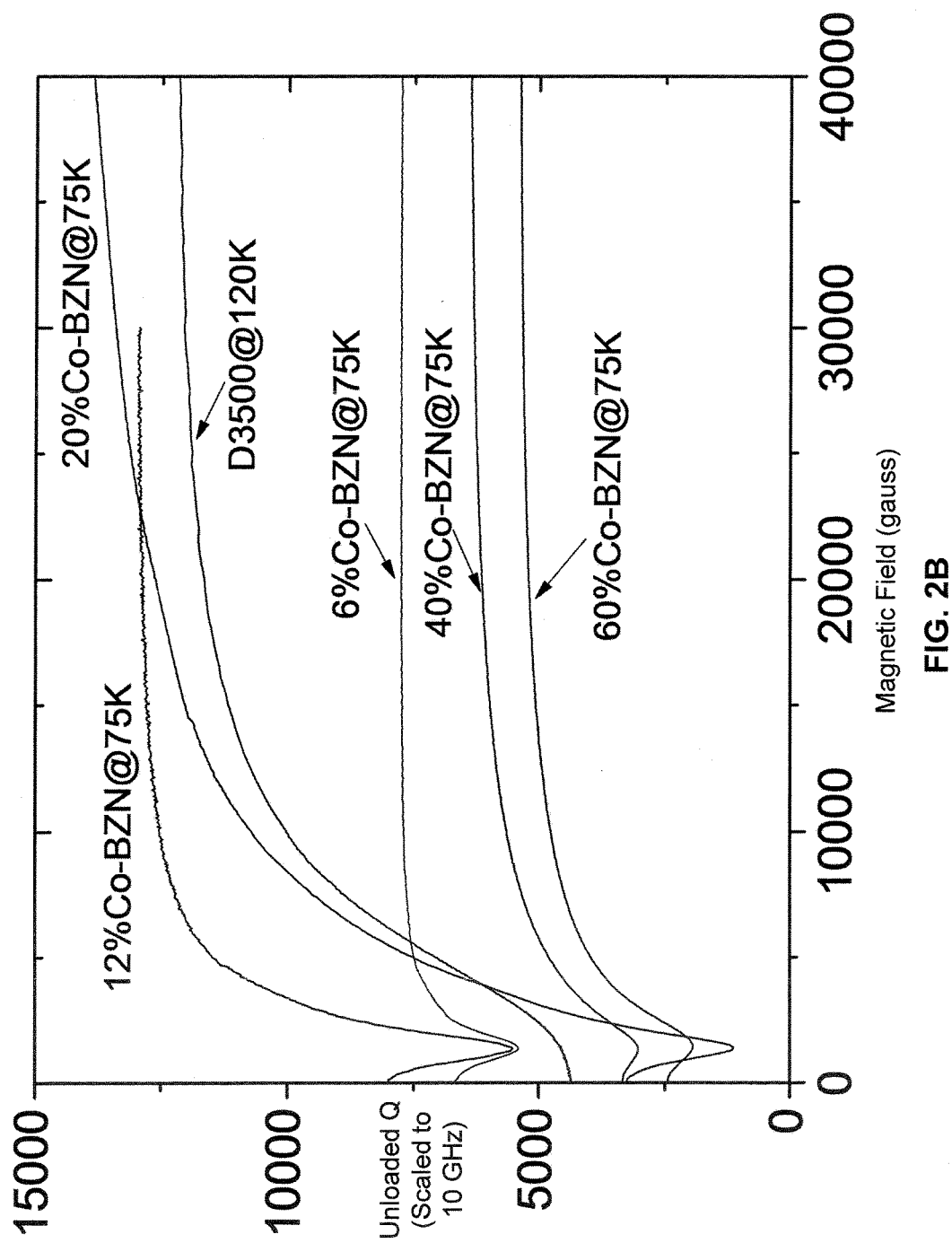
FIG. 2B illustrates unloaded Q factor for exemplary $Ba(Zn_{1/3}Nb_{2/3})O_3$ dielectric materials of various dopings and at various temperatures, all as a function of external magnetic field in accordance with an exemplary embodiment.

With reference now to FIG. 2B, principles of the present disclosure contemplate that, in various exemplary dielectric materials, unloaded Q factor often initially declines upon application of a small magnetic field (typically from about 0 T to a value of less than about 0.5 T, depending on material, and for many materials, less than about 0.2 T), and thereafter increases as the magnetic field increases. The initial drop in Q is due to electron paramagnetic resonance conditions, and the rise in Q is due to preferential spin orientation. Change in unloaded Q factor over a range of magnetic fields can be quite large. For example, for $Ba(Zn_{1/3}Nb_{2/3})O_3$ doped with Co to 20%, the difference in Q obtainable over the range 0 T to 4 T is more than one order of magnitude.

Skilled practitioners will appreciate that, as disclosed herein, loss in exemplary dielectric materials is highest during paramagnetic resonance conditions and is lowest at high magnetic fields (i.e., greater than about 0.5 T for operation at about 10 GHz). Paramagnetic resonance conditions generally occur at magnetic fields of less than 0.5 T for operation at about 10 GHz. Notably, the Zeeman energy separates the favored spin state in the B-field direction from the higher energy state that opposes it.

Figure 3A:
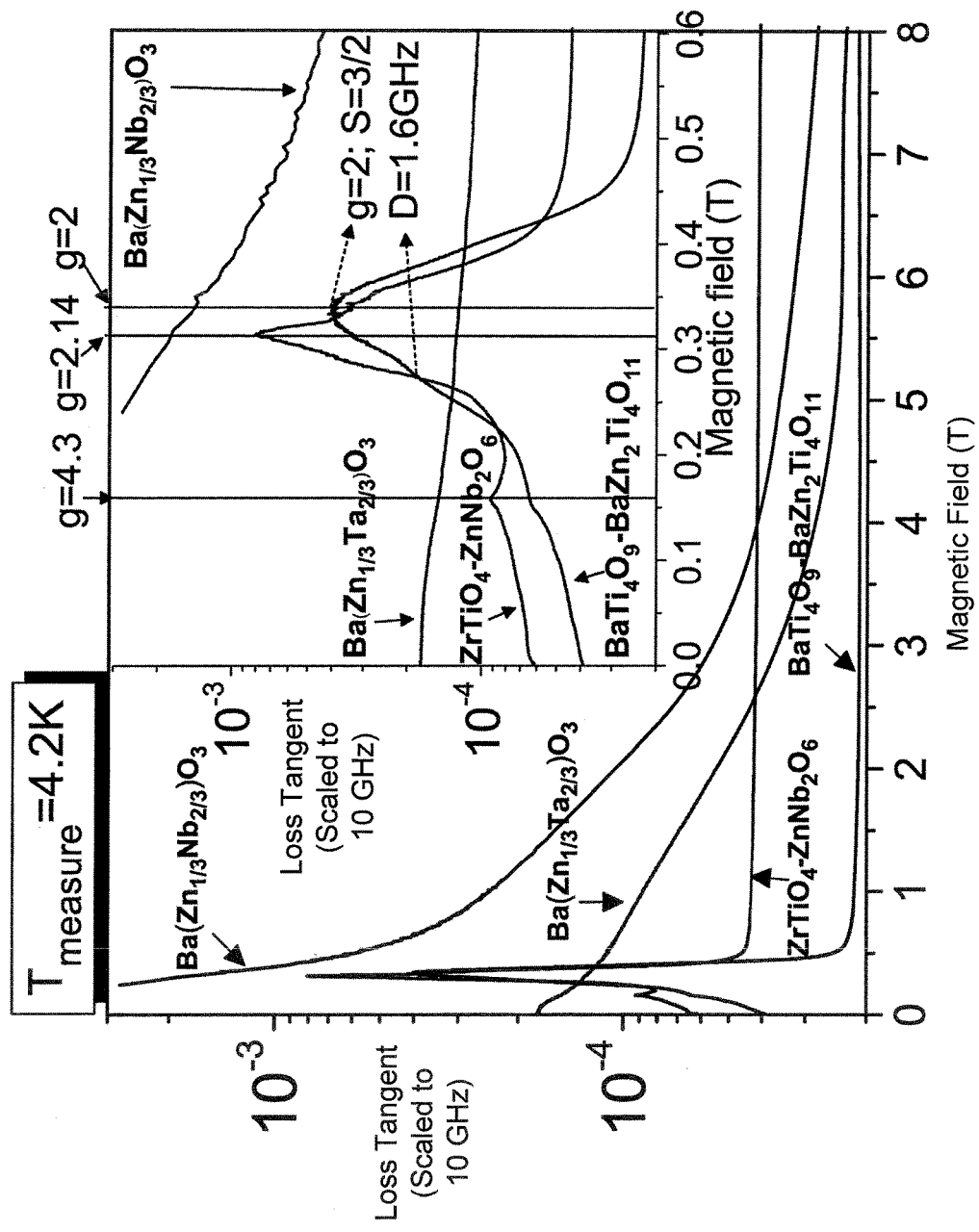
FIG. 3A illustrates loss tangent for exemplary commercially available dielectric materials at 4.2 K as a function of external magnetic field in accordance with an exemplary embodiment.
Figure 3B:
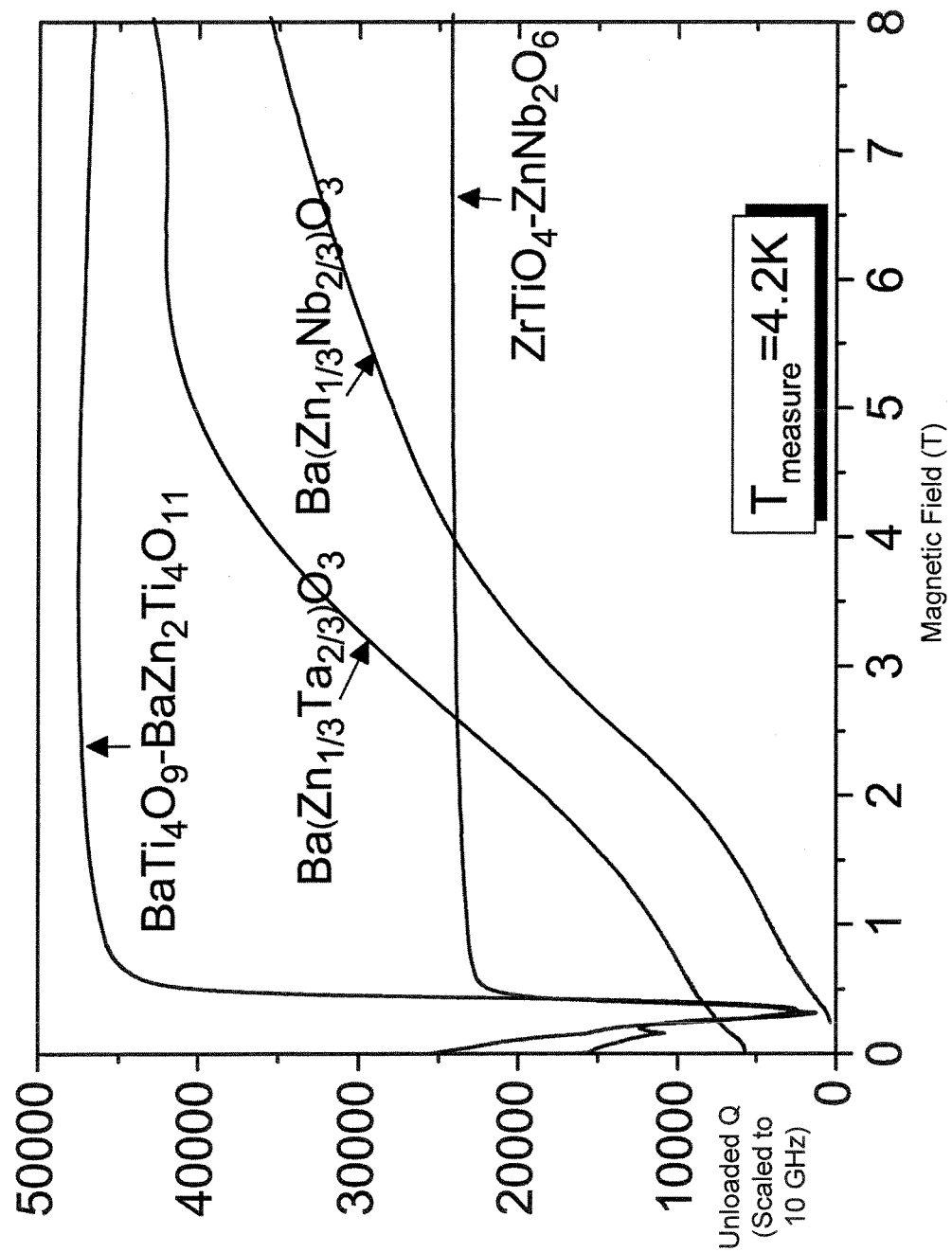
FIG. 3B illustrates unloaded Q factor for exemplary commercially available dielectric materials at 4.2 K as a function of external magnetic field in accordance with an exemplary embodiment.

With reference now to FIGS. 3A, and 3B, principles of the present disclosure contemplate that the loss tangent and quality factor of components comprising various exemplary dielectric materials, when operated at cryogenic temperatures, may be modified via application of an external magnetic field. In various exemplary embodiments, the loss tangent of certain exemplary materials may be reduced by more than two orders of magnitude at 4.2 K via application of an 8 T external magnetic field. Accordingly, it is clear that microwave loss can be largely suppressed by aligning the spin via application of a sufficiently strong static magnetic field.

Figure 3C:
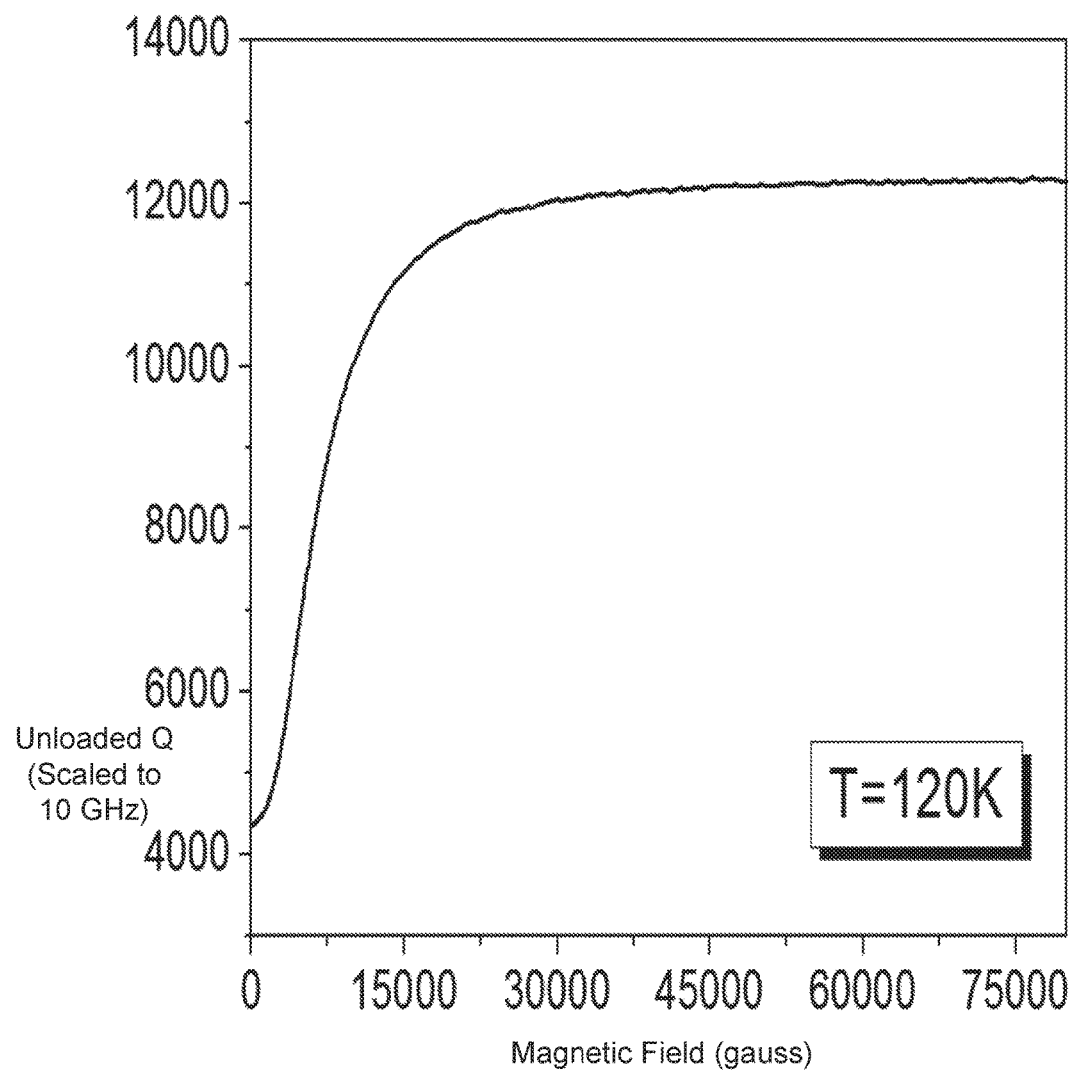
FIG. 3C illustrates unloaded Q factor for an exemplary commercially available dielectric material (D3500 (Ba$(Zn_{1/3}Nb_{2/3})O_3$+2Ba$(Co_{1/3}Nb_{2/3})O_3$) at 120 K as a function of external magnetic field in accordance with an exemplary embodiment.
Figure 3D:
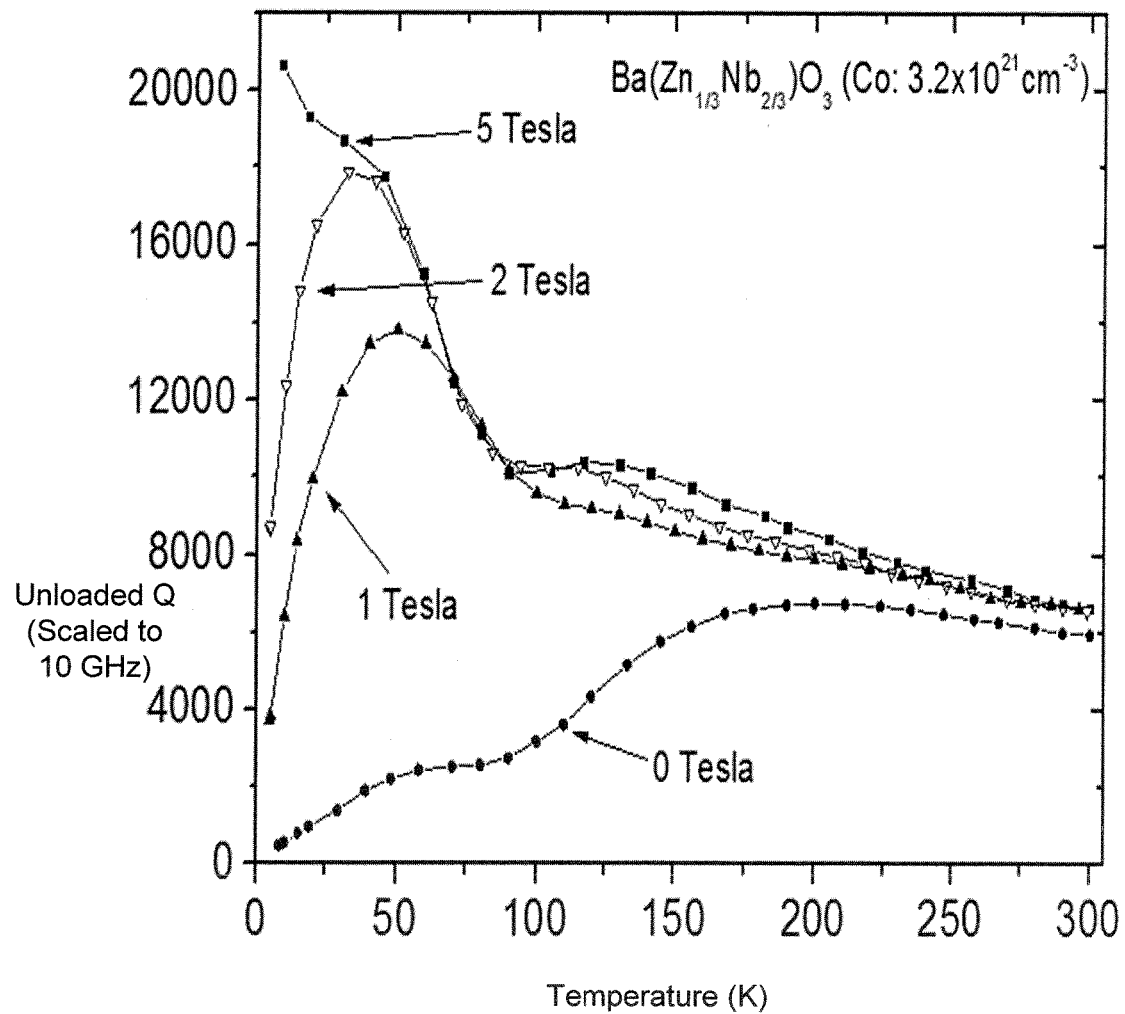
FIG. 3D illustrates unloaded Q factor for an exemplary commercially available dielectric material (Co-doped $Ba(Zn_{1/3}Nb_{2/3})O_3$) under various applied external magnetic fields and as a function of temperature in accordance with an exemplary embodiment.

Turning now to FIGS. 3C and 3D, principles of the present disclosure contemplate that the loss tangent and quality factor of components comprising various exemplary dielectric materials, when operated at moderately reduced temperatures (for example, about 120 K), may be modified via application of an external magnetic field. In various exemplary embodiments, the unloaded quality factor of certain exemplary materials may be increased by more than two orders of magnitude at 4.2 K and by a factor of significantly more than 2 at 120 K via application of an 8 T external magnetic field. Accordingly, principles of the present disclosure contemplate that these effects may be desirably utilized at temperatures greater than 4.2 K and up to and including 150 K. Notably, certain high-temperature superconductors (e.g., cuprates and/or iron pnictides) may desirably be utilized in electronic systems over much of this temperature range.

Figure 4A:
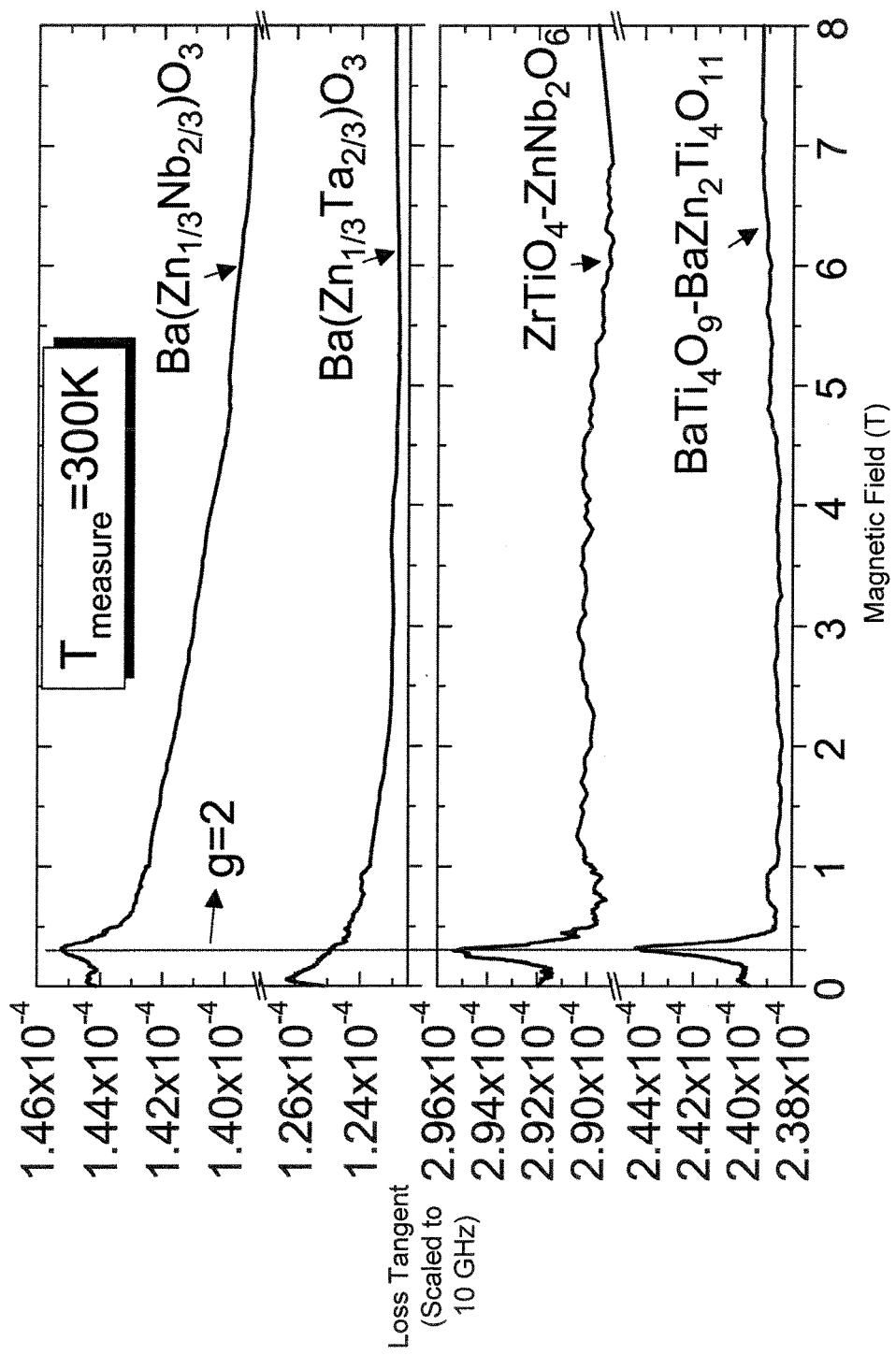
FIG. 4A illustrates loss tangent for exemplary commercially available dielectric materials at 300 K as a function of external magnetic field in accordance with an exemplary embodiment.
Figure 4B:
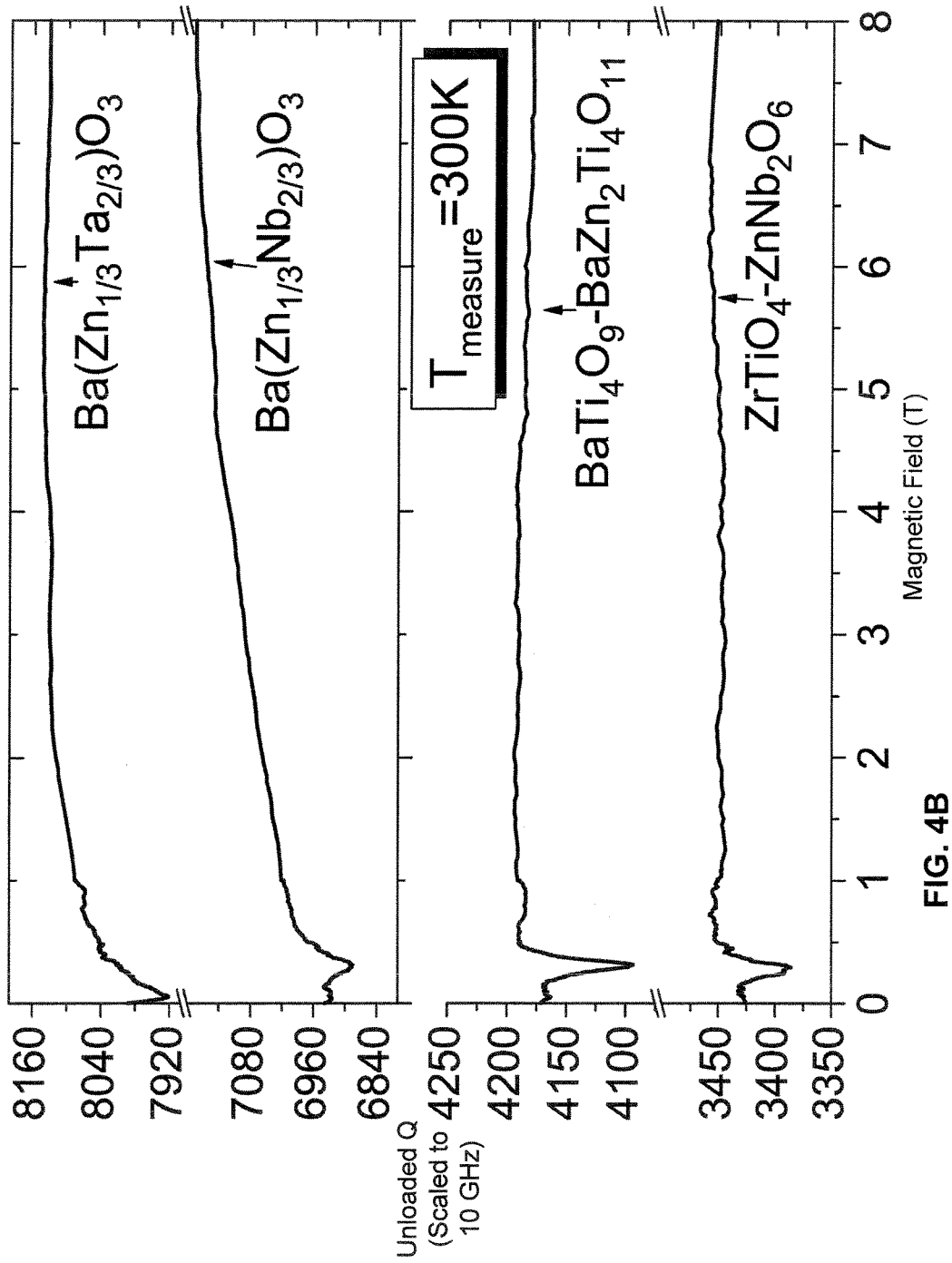
FIG. 4B illustrates unloaded Q factor for exemplary commercially available dielectric materials at 300 K as a function of external magnetic field in accordance with an exemplary embodiment.

Similarly, with reference now to FIGS. 4A and 4B, principles of the present disclosure contemplate that the loss tangent and quality factor of components comprising various exemplary dielectric materials, when operated at approximately room temperature (300 K), may be modified via application of an external magnetic field.

As illustrated in FIGS. 3A through 4B, it can be seen that spin excitations play a dominant role in microwave loss at cryogenic temperatures; moreover, spin excitations play a smaller role in microwave loss at room temperatures.

Figure 5:
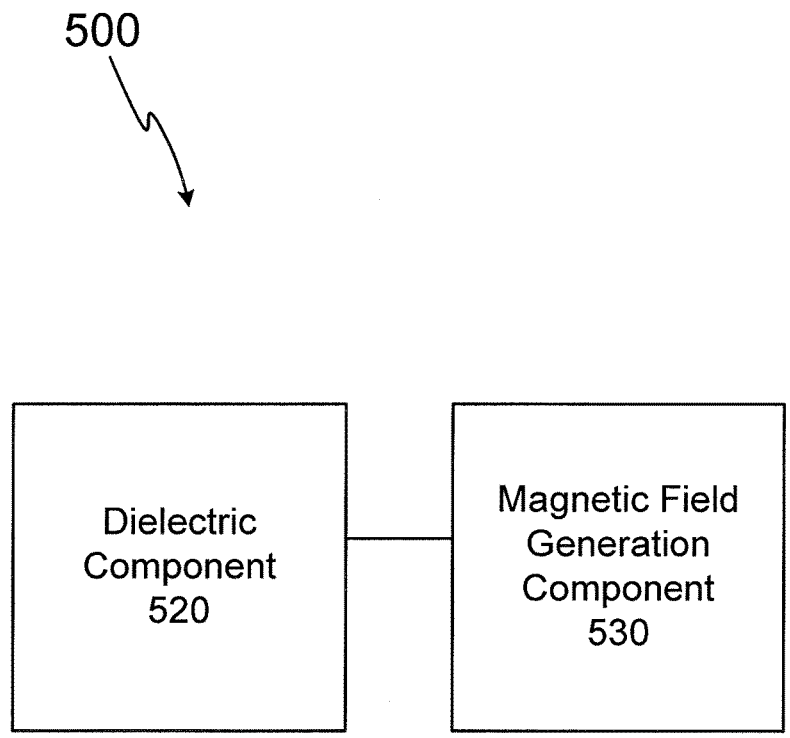
FIG. 5 illustrates a functional block diagram of an electrical device configured with a reduced loss tangent in accordance with various exemplary embodiments.

With reference now to FIG. 5, in various exemplary embodiments an electrical system, for example electrical system 500, may be configured with a dielectric component 520 and a magnetic field generation component 530. In an exemplary embodiment, dielectric component 520 comprises an electrical device (for example an oscillator, resonator, filter, amplifier, mixer, photonic detector, and/or the like) comprising an exemplary dielectric material as discussed hereinabove. Magnetic field generation component 530 is functionally coupled to dielectric component 520. Magnetic field generation component 530 is configured to generate a fixed and/or varying magnetic field and apply the magnetic field to dielectric component 520. Magnetic field generation component 530 may comprise one or more of a rare earth magnet, an electromagnet, an array of magnets, a solenoid, and/or any other suitable components configured to generate, modify, and/or control a magnetic field.

In exemplary embodiments wherein the magnetic field generated by magnetic field generation component 530 is static, magnetic field generation component 530 may be movable with respect to dielectric component 520 in order to vary the effective magnetic field applied to dielectric materials in dielectric component 520. In some exemplary embodiments wherein the magnetic field generated by magnetic field generation component 530 is variable, magnetic field generation component 530 may comprise various microprocessors and/or other control electronics, and/or power sources (batteries, external DC current sources, external A/C current sources, and/or the like), in order to control and/or modulate the effective magnetic field applied to dielectric materials in dielectric component 520. Moreover, any suitable methods and/or components for applying and/or varying a magnetic field to dielectric component 520 are considered to fall within the scope of principles of the present disclosure.

Figure 6A:
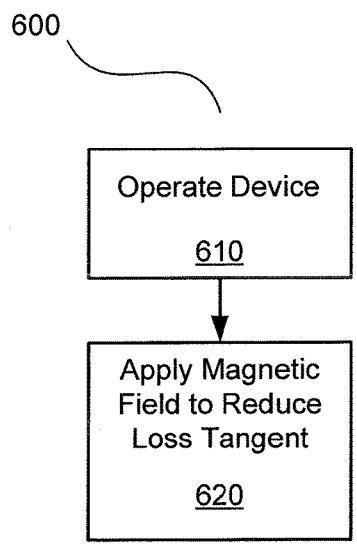
FIG. 6A illustrates a method for reducing the loss tangent of an electrical device in accordance with various exemplary embodiments.

With reference now to FIG. 6A, an exemplary method 600 for reducing the loss tangent in an electrical device comprises: operating an electrical device having a dielectric component, wherein the operating subjects the dielectric component to electromagnetic radiation having a frequency of between about 0.2 GHz and about 120 GHz (step 610); and applying a magnetic field to the dielectric component to reduce the loss tangent in the electrical device (step 620). In some exemplary embodiments, the operating subjects the dielectric component to electromagnetic radiation having a frequency of between about 3 GHz and about 30 GHz. In certain exemplary embodiments the operating subjects the dielectric component to electromagnetic radiation having a frequency of between about 6 GHz and about 11 GHz. In certain exemplary embodiments, the applied magnetic field has a value of 0.1 Tesla or more.

Figure 6B:
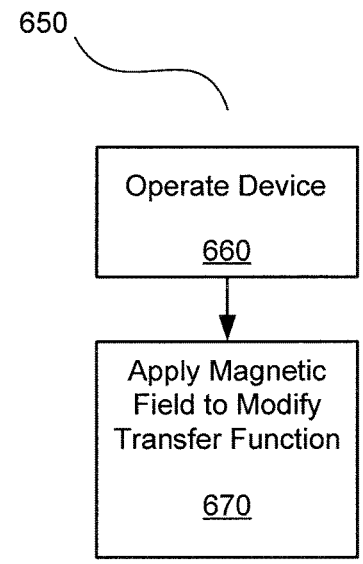
FIG. 6B illustrates a method for modifying the transfer function of an electrical device in accordance with various exemplary embodiments.

Turning to FIG. 6B, an exemplary method 650 for modifying the performance of an electrical device comprises: operating the electrical device having a dielectric component, wherein the operating subjects the dielectric component to electromagnetic radiation having a frequency of at least 0.2 GHz (step 660); and applying a magnetic field to the dielectric component to modify the transfer function of the electrical device (step 670). In some exemplary embodiments, the operating subjects the dielectric component to electromagnetic radiation having a frequency of between about 3 GHz and about 30 GHz. In certain exemplary embodiments the operating subjects the dielectric component to electromagnetic radiation having a frequency of between about 6 GHz and about 11 GHz. In certain exemplary embodiments, the applied magnetic field has a value of 0.1 Tesla or more.

Principles of the present disclosure contemplate use of external magnetic fields to effectively turn a microwave device "on" (i.e., by significantly decreasing the loss tangent of the dielectric and/or modifying the Q of the device) via application of an external magnetic field. Similarly, the applied magnetic field may be reduced and/or removed to effectively turn the microwave device "off" (i.e., by significantly increasing the loss tangent of the dielectric and/or modifying the Q of the device). These exemplary operations may be selected to manipulate the performance of a device over the entire frequency range of operation, or only over a subset thereof. Additionally, the strength of an applied magnetic field may be varied and/or modulated to achieve an intermediate range of effects in the microwave device. In this manner, microwave devices may be operated under a variety of regimes and/or with a variety of transfer functions, i.e., in order to provide a type of selectivity by an external input that may be considered somewhat analogous to operation of a transistor.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

When a phrase similar to "at least one of A, B, or C" or "at least one of A, B, and C" is used in the claims or specification, Applicants intend the phrase to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A method for modifying the loss tangent in an electrical device, the method comprising:
    operating the electrical device having a dielectric component containing a paramagnetic additive, wherein the operating subjects the dielectric component to microwave radiation; and
    applying a static magnetic field to the dielectric component to modify the loss tangent in the dielectric component, wherein the dielectric component comprises Ni- and Zr-alloyed $Ba(Zn_{1/3}Ta_{2/3})O_3$, and wherein the magnetic field has a strength exceeding 0.1 Tesla.

2. The method of claim 1, wherein the modification of the loss tangent is a reduction of the loss tangent.

3. The method of claim 1, wherein the paramagnetic additive comprises at least one of a transition metal or a rare earth element.

4. The method of claim 1, dielectric component further comprises at least one of:
    Co-alloyed $Ba(Zn_{1/3}Nb_{2/3})O_3$,
    $ZrTiO_4$—$ZnNb_2O_6$, or
    $BaTi_4O_9$—$BaZn_2Ti_4O_{11}$.

5. The method of claim 1, wherein applying the static magnetic field results in modification of the spin loss properties in the dielectric component.

6. The method of claim 1, wherein during the operating, the dielectric component is cooled to a temperature lower than 150 Kelvin.

7. The method of claim 6, wherein the loss tangent of the dielectric component is reduced by more than a factor of 2 responsive to application of the static magnetic field.

8. The method of claim 6, wherein the loss tangent of the dielectric component is reduced by at least two orders of magnitude responsive to application of the static magnetic field.

9. The method of claim 1, wherein the applying the static magnetic field to the dielectric component causes paramagnetic ions of the paramagnetic additive to assume a preferential spin alignment.

10. The method of claim 1, wherein the applying the static magnetic field to the dielectric component causes paramagnetic ions of the paramagnetic additive to attain a resonant condition.

11. A method for varying the transfer function of an electrical device, the method comprising:
    operating the electrical device having a dielectric component containing a paramagnetic additive, wherein the operating subjects the dielectric component to microwave radiation; and
    applying a magnetic field to the dielectric component to modify the transfer function of the electrical device, wherein the dielectric component comprises Ni- and Zr-alloyed Ba(Zn1/3Ta2/3)O3.

12. A method for reducing loss in a dielectric material, the method comprising:
    determining, for paramagnetic ions in the dielectric material, a preferential spin alignment; and
    applying, to the dielectric material, a static magnetic field to cause the paramagnetic ions to assume the preferential spin alignment, wherein the dielectric component comprises Ni- and Zr-alloyed Ba(Zn1/3Ta2/3)O3.

* * * * *